United States Patent
He et al.

(10) Patent No.: US 9,633,884 B2
(45) Date of Patent: Apr. 25, 2017

(54) PERFORMANCE ENHANCEMENT OF COATING PACKAGED ESC FOR SEMICONDUCTOR APPARATUS

(71) Applicant: Advanced Micro-Fabrication Equipment Inc, Shanghai, Shanghai (CN)

(72) Inventors: Xiaoming He, Shanghai (CN); Tuqiang Ni, Shanghai (CN)

(73) Assignee: ADVANCED MICRO-FABRICATION EQUIPMENT INC, SHANGHAI, Shanghai (CN)

(*) Notice: Subject to any disclaimer, the term of this patent is extended or adjusted under 35 U.S.C. 154(b) by 769 days.

(21) Appl. No.: 14/065,260

(22) Filed: Oct. 28, 2013

(65) Prior Publication Data
US 2014/0118880 A1    May 1, 2014

(30) Foreign Application Priority Data
Oct. 29, 2012  (CN) .......................... 2012 1 0421961

(51) Int. Cl.
| | | |
|---|---|---|
| H01T 23/00 | (2006.01) | |
| H01L 21/683 | (2006.01) | |
| C23C 16/30 | (2006.01) | |
| C23C 16/40 | (2006.01) | |

(52) U.S. Cl.
CPC .......... *H01L 21/6833* (2013.01); *C23C 16/30* (2013.01); *C23C 16/40* (2013.01); *Y10T 29/49002* (2015.01)

(58) Field of Classification Search
CPC .................................. H01L 21/6833
USPC .......................................... 361/234
See application file for complete search history.

(56) References Cited

U.S. PATENT DOCUMENTS

| | | | | |
|---|---|---|---|---|
| 5,909,354 A * | 6/1999 | Harada | ..................... | B23Q 3/15 279/128 |
| 6,771,483 B2 * | 8/2004 | Harada | ............... | H01L 21/6833 361/234 |
| 7,608,162 B2 * | 10/2009 | Ohmoto | ................ | H01J 37/321 118/723 E |
| 8,619,406 B2 * | 12/2013 | Cho | .................... | H01L 21/6831 361/234 |
| 2010/0119843 A1 | 5/2010 | Sun et al. | | |

FOREIGN PATENT DOCUMENTS

| | | |
|---|---|---|
| CN | 102210196 A | 10/2011 |
| TW | 201120988 A1 | 6/2011 |

OTHER PUBLICATIONS

First Office Action for Chinese Patent Application No. 201210421961.0 dated Sep. 6, 2015.

* cited by examiner

*Primary Examiner* — Stephen W Jackson
(74) *Attorney, Agent, or Firm* — Womble Carlyle Sandridge & Rice LLP; Joseph Bach, Esq.

(57) ABSTRACT

An advanced coating for electrostatic chuck used in plasma processing chamber is provided. The advanced coating is formed using plasma enhanced physical vapor deposition. The coating is generally of $Y_2O_3/Al_2O_3$, although other material combinations can be used. Also, a multi-layered coating can be formed, such that an intermediate coating layer can be formed using standard plasma spray, and a top coating can be formed using PEPVD. The entire ESC assembly can be "packaged" by the coating.

17 Claims, 5 Drawing Sheets

PERFORMANCE ENHANCEMENT OF COATING PACKAGED ESC FOR SEMICONDUCTOR APPARATUS

This application claims the priority of Chinese Patent Application No. 201210421961.0, entitled "PERFORMANCE ENHANCEMENT COATING PACKAGED FOR SEMICONDUCTOR APPARATUS", filed with the Chinese Patent Office on Oct. 29, 2012, which is incorporated by reference in its entirety herein.

BACKGROUND

1. Field

The subject invention relates to plasma processing chambers and, in particular, to a coating for an electrostatic chuck of a plasma processing chamber, which enhances the performance of the chuck in the presence of active plasma species.

2. Related Art

In plasma processing chambers, an electrostatic chuck (ESC) is often used to support the processed substrate inside the chamber. In certain plasma chambers, such as plasma etch chambers, the ESC may also function as an electrode, coupled to either ground or RF potential. During processing, at least part of the ESC is exposed to the plasma and is attacked by the active species within the plasma, such as halogen plasma of $CF_4$, $Cl_2$, etc. Additionally, the ESC is exposed to mechanical abrasion from the substrates it supports. Finally, in some cases various plasma cleaning procedures are employed, wherein the interior of the chamber is cleaned using plasma species. In many such cleaning procedures no wafer is present on the ESC, such that the entire substrate-supporting surface of the ESC is exposed to plasma.

Various coatings have been proposed and tested in the prior art for protecting plasma chamber parts from plasma erosion. One typical application is the plasma sprayed (PS) $Y_2O_3$ or $Al_2O_3$ on ESC base that could be metal, alloy or ceramics. Plasma sprayed $Al_2O_3$ coated ESC has been used for a quite long time, but it introduces the risk of aluminum contamination of the processed substrate. On the other hand, plasma sprayed $Y_2O_3$ ESC has a soft surface which is easily damaged by the substrates, creating particles and contamination of the processed substrate.

Generally, Yttria ($Y_2O_3$) coating is believed to be promising; however, it has been very difficult to find a process that results in good coating, especially one that does not crack or generate particles. For example, there have been proposals to use plasma spray to coat parts made of metal, alloy or ceramic. However, conventional plasma spray Y2O3 coating is formed by sprayed $Y_2O_3$ particles, and generally results in a coating having high surface roughness (Ra of 4 micron or more) and relatively high porosity (volume fraction is above 3%). The high surface roughness and porous structure makes the coating susceptible to generation of particles, which may contaminate the substrate being processed.

Other proposals for forming Yttria coating involve using chemical vapor deposition (CVD), physical vapor deposition (PVD), ion assisted deposition (IAD), ionized metal plasma (IMP), active reactive evaporation (ARE), sputtering deposition, and plasma immersion ion process (PIIP). However, all these deposition processes have some technical limitations such that they can not be actually used to scale up for the deposition of thick coating on the chamber parts for the plasma attack protections. For instance, CVD of $Y_2O_3$ can not be carried out on substrates that cannot sustain temperatures above 600 C, which excludes the deposition of plasma resistant coating on chamber parts that are made of aluminum alloys. PVD process, such as evaporation, can not deposit thick ceramic coating because of their poor adhesion to substrate. Other deposition processes can not deposit thick coating either due to the high residual stress and poor adhesion (such as sputtering deposition, ARE and IAD) or the very low deposition rate (such as sputtering deposition, IMP and PIIP). Therefore, so far no satisfactory film has been produced, that would have good erosion resistance, while generating low or no particles and can be made thick without cracking or delamination.

In view of the above-described problems in the art, a solution is needed for a coated ESC with coating that resists plasma species attack and does not generate particle or cracks. The coating should have acceptable roughness and porosity values, enough hardness and good thermal conductivity, so that it could provide long service life. The process for fabricating the coating should allow thick coating without being susceptible to cracking or delamination.

SUMMARY

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

According to an aspect of the invention, methods are provided for the formation of advanced plasma resistant coatings on electrostatic chucks. According to various embodiments, the process of the coating the chuck's surface is provided so that the service performance of the coated chuck is improved. Other embodiments involve the modification and installation of the coated chuck into the plasma chamber, so as to improve the plasma process quality.

In an exemplary process, an advanced Yttria coating, e,g, $Y_2O_3$ or $YF_3$ coatings, with fine/compact grain structure is created by a plasma enhanced physical vapor deposition (PEPVD) process, in which (1) the deposition is carried out in a low pressure or vacuum chamber environment; (2) at least one deposition element or component is evaporated or sputtered out off a material source and the evaporated or sputtered out material condenses on the substrate surface (this part of the process is a physical process and is referred to herein as the physical vapor deposition or PVD part); (3) meanwhile, a plasma source (or sources) is (are) used to emit out ions and to generate plasma that surrounds the ESC assembly's surface and at least one deposition element or component is ionized and reacted with the evaporated or sputtered elements or components in plasma or on the surface of the ESC assembly; and (4) the ESC assembly is coupled to a negative voltage, such that it is bombarded by the ion or particles during the deposition process. The actions from (3) and (4) are referred to as the "plasma enhanced" function of the PEPVD.

It should be mentioned that the plasma source(s) could be used either (1) to ionize and activate the reactive gases so that the deposition process can be performed in a low substrate temperature and with a high coating growth rate, or (2) to generate the energetic ions aimed at the ESC assembly so that the ion impinges on the surface of the ESC assembly and helps to form the thick and dense coatings thereon. More perfectly, the plasma sources will be used as the alternative or the combinations of functions (1) and (2), to lead the formation of the coating on the ESC assembly. Such a coating synthesized with the enough thickness and the dense structure is generally referred to herein as "advanced coating" (e.g. A-coating), for instance, such as A-$Y_2O_3$, A-$YF_3$ or A-$Al_2O_3$ based coatings.

According to one embodiment, an A-coatings with the desired properties is applied so as to improve the ESC service function. Comparing to the current plasma spray $Y_2O_3$ ESC whose soft surface is easy damaged by Si wafer, and plasma spray $Al_2O_3$ ESC whose surface is easily eroded by plasma, the advanced coating applied to ESC has hard surface, stable structure to plasma, and improved functions such as good thermal conductivity, stable high electrical resistivity, etc. To reach these properties targets, the invented A-coating is hybrid materials that consist of at least 2 ceramic components and has the combined properties from the hybrid ceramic components. The typical example, but not limited to, is the hybrid $Y_2O_3/Al_2O_3$ coating with different ratio of $Y_2O_3$ and $Al_2O_3$. This is because $Y_2O_3$ has stable structure in plasma and $Al_2O_3$ has high hardness and good thermal conductivity, so that the mixed or hybrid $Y_2O_3/Al_2O_3$ could have high hardness, good thermal conductivity, and stable structure in plasma. In addition, both materials have extremely high electrical resistivity.

According to another embodiment, the ESC assembly is "packaged" in the A-coating. That is, the ESC is assembled with all of its parts, and the entire ESC assembly is coated with the A-coating (e.g., A-$Y_2O_3$, A-$Al_2O_3$, A-$YF_3$, hybrid A-$Y_2O_3/Al_2O_3$ or hybrid A-$YF_3/Al_2O_3$, etc). In one example, the various parts forming the ESC are first assembled, and then are positioned inside the PEPVD chamber to form the advanced coating over the surface of the entire assembly. In this manner, the ESC assembly is "packaged" by the advanced coating and is fully protected from plasma erosion and wafer abrasion.

In order to reduce the production cost, another embodiment involves the formation of double layered coating combinations in which the first coating is formed on the chuck, such as anodization, plasma spray $Y_2O_3$, plasma spray $Al_2O_3$, or other plasma resistant coatings, with a certain thickness designed to maintain certain electrical properties and to reach the improved performance of the chuck. A second coating is formed over the first layer to form a top surface facing to plasma in the plasma processes. The second coating can be formed as the A-coating (e.g. A-$Y_2O_3$, A-$Al_2O_3$, A-$YF_3$, hybrid A-$Y_2O_3/Al_2O_3$ or hybrid A-$YF_3/Al_2O_3$, etc), so that the formed coatings have smooth surface (surface roughness can be reduced to 1.0 um) and dense crystal or amorphous structure with reduced porosity (less than 1%) or even with no porosity. Consequently, particle contamination, which is usually induced by plasma spray coating due to the rough surface and porous structure, can be reduced. In addition, due to the dense and compact grain structure, the second coating has reduced plasma erosion rate, which could further reduce metal contamination in the plasma processes. Also, the inclusion of, such as $Al_2O_3$, ZrO2, etc., enhances the coating resistance to abrasion.

The thicknesses of either the first coating or the second coating can be adjusted according to the performance requirement on the chuck. In order to get the diverse functions of the coated chuck, the surface of the chuck could be further coated by multi-layered coating combinations, such that the chuck would have a stable surface facing the plasma chemistry and the desired functions to improve the process performance of the plasma chamber.

In another embodiment, in order further to improve the performance of the coating packaged ESC assembly, surface processes are applied on the as-coated ESC assembly, which includes, but not limited to, surface smoothening or roughening to reduce the particles, surface modification to enhance the surface density and stability of the coatings, and surface chemical cleaning to remove the particles and contamination that are formed on the coated ESC either due to the coating deposition process or due to the plasma etching process.

According to another aspect, the energetic ion bombardment or plasma etching in the PEPVD is used to smooth and densify the surface of A-coating coated ESC. The coated ESC surface can be cleaned and smoothed by wet solution cleaning in which the erosive solution or slurry or aerosol is used to blast away the surface particles and to control the surface smoothness of the coating. The dense and smooth surface layer could have crystal or amorphous structure with reduced porosity or without porosity, and thus reduce the plasma erosion rate and maintain clean environment during the plasma etch processes.

BRIEF DESCRIPTION OF THE DRAWINGS

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIGS. 5(*a*)-5(*b*) are micrographs illustrating the $Y_2O_3$ coating achieved using standard plasma spray.

FIGS. 5(*c*)-5(*d*) are micrographs illustrating coatings deposited using PEPVD according to embodiments of the invention.

DETAILED DESCRIPTION

Various embodiments will now be described, providing improved coatings for ESC, which improve erosion and particle performance of the ESC. The description will include an example of an apparatus and method for forming the coating, and also examples of ESC and coatings fabricated using the disclosed method.

Figure 8:
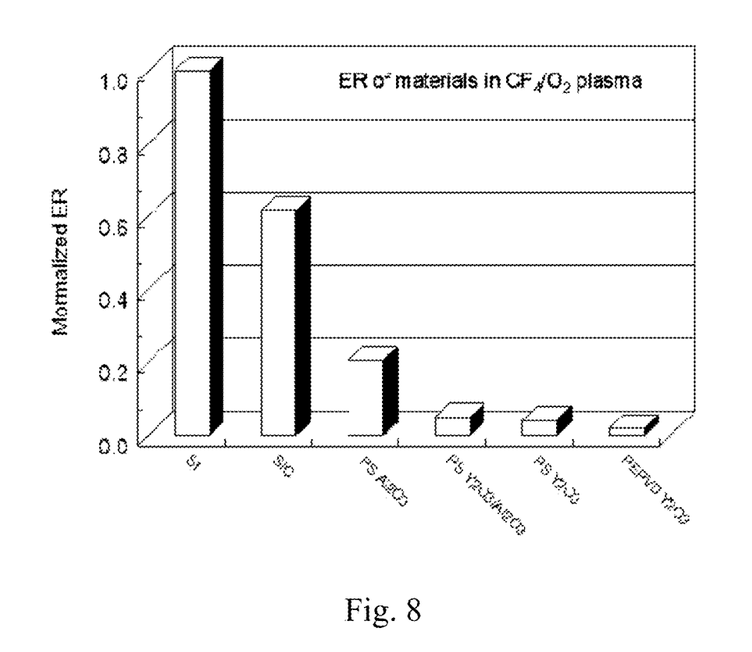
FIG. 8 illustrates that $Y_2O_3/Al_2O_3$ mixed coating has higher etch resistance than pure $Al_2O_3$.

Table 1 lists various characteristics and properties of plasma spray $Y_2O_3$, plasma spray $Al_2O_3$ and plasma spray $Y_2O_3/Al_2O_3$. As shown in Table 1, plasma spray $Y_2O_3/Al_2O_3$ mixed coating has higher hardness than $Y_2O_3$, while providing similar electrical resistivity. That is, while the $Y_2O_3/Al_2O_3$ mixed coating has a somewhat lower hardness than pure $Al_2O_3$, it has higher hardness than pure $Y_2O_3$. On the other hand, as shown in FIG. 8, $Y_2O_3/Al_2O_3$ mixed coating has higher etch resistance than pure $Al_2O_3$. Therefore, the $Y_2O_3/Al_2O_3$ mixed coating incorporates the benefits of adequate hardness and good etch resistance. Also, while not reported in Table 1, the $Y_2O_3/Al_2O_3$ mixed coating also has good thermal conductivity that is better than $Y_2O_3$. It can be expected that A-coatings, such as A-$Y_2O_3/Al_2O_3$, prepared by PEPVD will further have the increased hardness and the improved thermal conductivity due to their porous free dense coating structures.

TABLE 1

The properties of PS $Y_2O_3$, PS $Al_2O_3$, and PS $Al_2O_3/Y_2O_3$

| PS Coating | 40% $Al_2O_3$—60% $Y_2O_3$ | $Al_2O_3$ | $Y_2O_3$ |
|---|---|---|---|
| Purity (wt %) | 99.9 | 99.99 | 99.9 |
| Density (G/cm$^3$) | 3.6-3.8 | 3.6 | 4.5 |
| Porosity | <2 | ~4 | ~4 |
| 5% HCl erosion time (Hr) | 8 | >8 | >6 |
| Hardness (GPa) | 9.1~11.2 | 14.3 | 5.6 |
| Coefficient of Thermal Conductivity (W/m · k) | — | 14.5 | 6.8 |
| Volume Resistivity (Ω · cm) | ≥1E+14 | ≥1E+14 | ≥1E+14 |

Note:
The properties are measured at room temperature.

Figure 1:
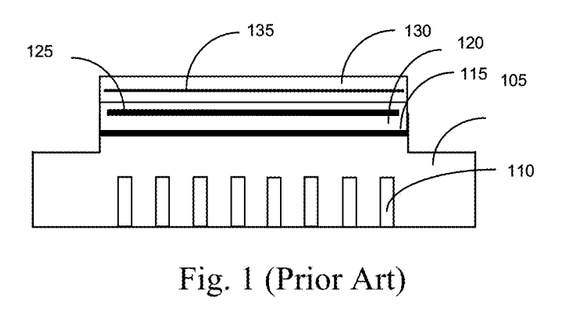
FIG. 1 is a schematic illustrating the major parts of a conventional electrostatic chuck.

FIG. 1 illustrates the main parts of a conventional ESC used in plasma chambers, such as, e.g., plasma etch chambers. A base 105 is generally made of a metallic material, such as, e.g., aluminum alloy. The base 105 has cooling channels 110 bored for circulating cooling fluid therein. A thermal barrier 115 is provided on top of the base 105, and a dielectric layer 120 is attached to the barrier 115. A heater 125, such as a resistive heater, is embedded within the dielectric layer 120. A dielectric insulated and high thermal conductivity layer 130 is provided over the dielectric layer 120, and an electrode 135 is embedded within the dielectric insulated and high thermal conductivity layer 130. In one example, the thermal barrier layer 115 may be specially formulated adhesives, and the dielectric layer 120 and the dielectric insulated but thermal conductive layer 130 may be the same materials, such as AlN or $Al_2O_3$.

Figure 2:
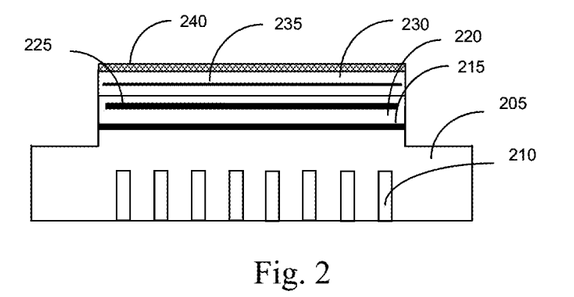
FIG. 2 illustrates an ESC according to an embodiment of the invention.
Figure 3:
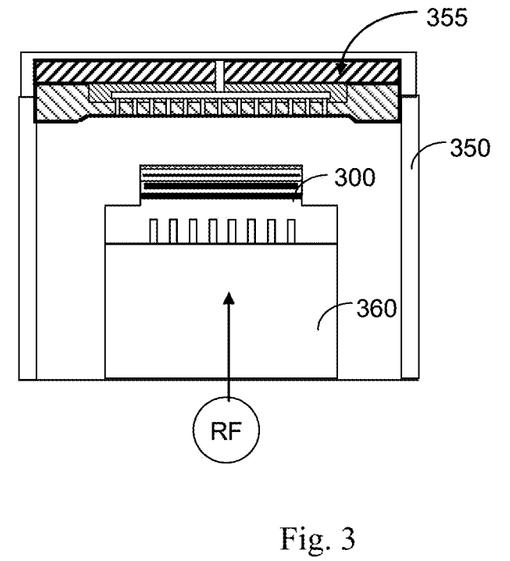
FIG. 3 illustrates a plasma processing chamber utilizing an ESC 300 according to an embodiment of the invention.

FIG. 2 illustrates an ESC according to an embodiment of the invention; while FIG. 3 illustrates a plasma processing chamber 350 utilizing an ESC 300 according to an embodiment of the invention and having a showerhead 355. The various elements making up the ESC are similar to the ESC shown in FIG. 1, and the similar elements are marked with similar reference numerals, except that they are in the 2xx series.

As shown in FIG. 2, the top surface of the ESC is coated with coating 240, which, in one embodiment, is an $Y_2O_3/Al_2O_3$ mixture. According to one embodiment, the mixture is 40% $Al_2O_3$ and 60% $Y_2O_3$. Unlike plasma spray, in which the coating is deposited in atmospheric environment, the advanced coating in this embodiment is deposited in vacuum environment. Also, while in plasma spray the coating is deposited using small powdery particles, the advanced coating is deposited by the condensation of atoms or radicals on the materials surfaces. Consequently, the characteristics of the resulting coating layer is different from the prior art coating, even when the same material composition is used. For example, it was found that a $Y_2O_3/Al_2O_3$ coating deposited according to embodiment of the invention has practically no porosity, has a smooth surface, increased hardness, and has a much higher etch resistance than conventional plasma spray $Y_2O_3/Al_2O_3$ coating.

Figure 4:
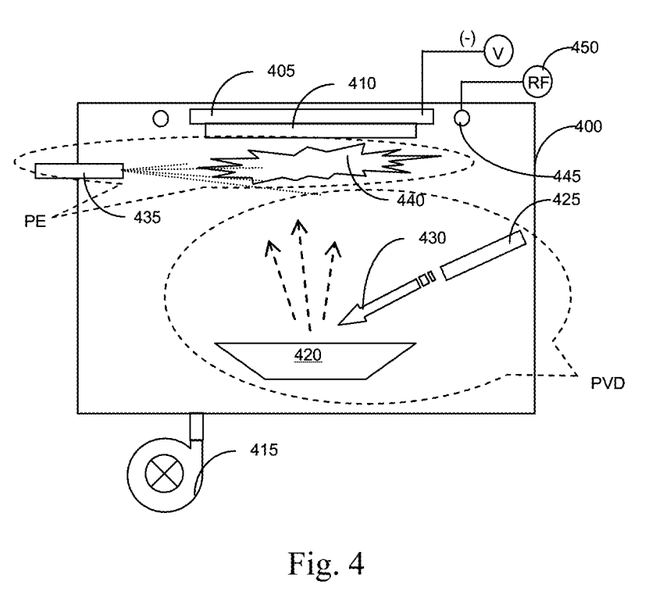
FIG. 4 illustrates an apparatus for depositing advanced coating in accordance with one embodiment of the invention.

An embodiment of the equipment and method for depositing the advanced coating according to various embodiments will now be described. FIG. 4 illustrates an apparatus for depositing advanced coating in accordance with one embodiment of the invention. This apparatus is used for depositing the advanced coating using the process referred to herein as PEPVD, wherein the PE and PVD components are highlighted by the broken-line callouts in FIG. 4. Traditionally, chemical vapor deposition (CVD) or plasma enhanced chemical vapor deposition (PECVD) refer to a chemical process wherein a thin film is formed on the substrate's surface by exposing the substrate to one or more volatile precursors, which react and/or decompose on the substrate surface to produce the desired deposited film. PVD, on the other hand, refers to a coating method which involves purely physical processes, wherein thin films are deposited on the surface of the substrate by the condensation of a vaporized or sputtered form of the desired film material. Therefore, one may characterize PEPVD as somewhat of a hybrid of these two processes. That is, the disclosed PEPVD involves both physical process of vapor condensation (the PVD part) and plasma induced chemical reaction in the chamber and on the substrate's surface (the PE part).

In FIG. 4, chamber 400 is evacuated by vacuum pump 415. The part 410 to be coated, e.g., the electrode part of the ESC, is attached to a holder 405. Also, a negative bias is applied to the part 410, via holder 405.

A source material 420 containing species to be deposited is provided, generally in a solid form. For example, if the film to be deposited is $Y_2O_3/Al_2O_3$, source material 420 would include yttrium and aluminum-possibly with other materials, such as oxygen, fluorine, etc. The yttrium and aluminum may be provided as an alloy in a single source, in which case the deposited coating will have the same composition as the source. However, for the evaporation deposition of multi-component coatings, such as hybrid $Y_2O_3/Al_2O_3$ coatings, it had better to use two evaporation sources; one is for yttrium and another for aluminum. This is because for the same power level of the evaporator, different materials exhibit different evaporation rates. Therefore, it is easier to control the coating composition if the different elements or components are evaporated separately.

To form the physical deposition, the source material is evaporated or sputtered. However, evaporation is usually used as it has much higher deposition rate than the sputtering. In the example of FIG. 4, the evaporation is achieved using electron gun 425, directing electron beam 430 onto the source material 420. As the source material is evaporated, atoms and molecules drift towards and condense on the part 410 to be coated, as illustrated by the broken-line arrows.

The plasma enhanced part is composed of a gas injector 435, which injects into chamber 400 reactive and non-reactive source gases, such as argon, oxygen, fluorine containing gas, etc., as illustrated by the dotted lines. Plasma 440 is sustained in front of part 410, using plasma sources, e.g., RF, microwave, etc., one of which in this example is shown by coil 445 coupled to RF source 450. Without being bound by theory, it is believed that several processes take place in the PE part. First, non-reactive ionized gas species, such as argon, impinging the part 410, so as to condense the film as it is being "built up." The effects of ion impinging may result from the negative bias on part 410, or from the ions emitted out from the plasma sources and aimed at part

405. Second, reactive gas species, such as oxygen or fluorine, react with the evaporated or sputtered source material, either inside the chamber or on the surface of the part 410. For example, the source yttrium reacts with the oxygen gas to result in $Y_2O_3$, and the source aluminum reacts with oxygen gas to form $Al_2O_3$. Thus, the resulting process has both a physical (impingement and condensation) component and a chemical component (ionization and oxidation).

Figure 5:
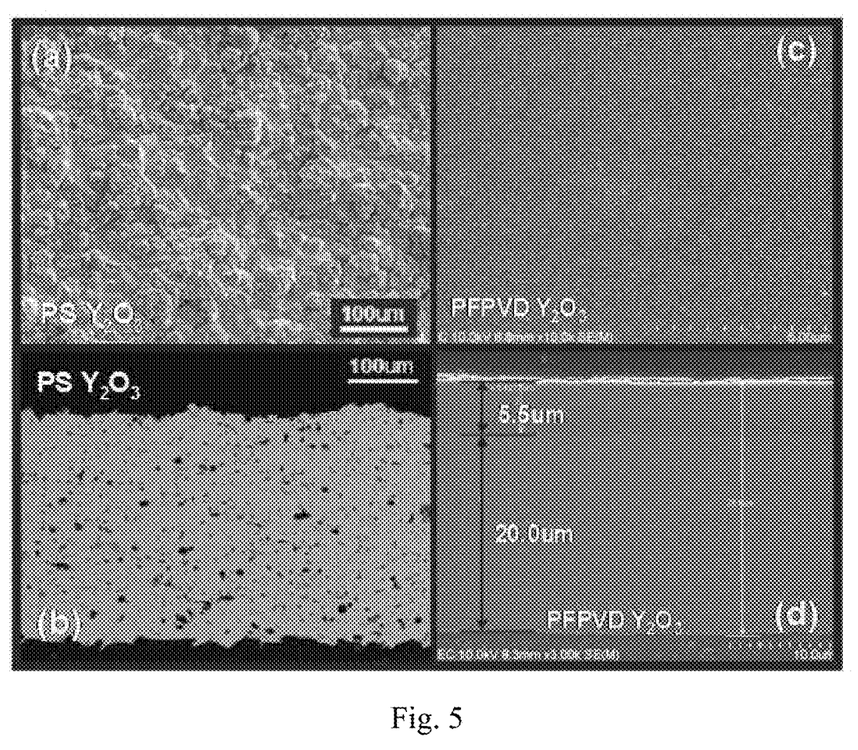

FIGS. 5(*a*) and 5(*b*) show the surface and cross-sectional morphologies of conventional plasma sprayed $Y_2O_3$. These micrographs can be contrasted with those of FIGS. 5(*c*) and 5(*d*), showing the smooth and dense A-$Y_2O_3$ coating prepared on hard anodized Al6061 by the low temperature plasma enhanced PVD (PEPVD) process. FIG. 5(*d*) is a cross-section micrograph showing a double layered PEPVD $Y_2O_3$ coating without any porous defect in the cross-sectional structure. PEPVD A-$Y_2O_3$ has extreme low plasma erosion rate, as the data shows in FIG. 8.

Figure 6:
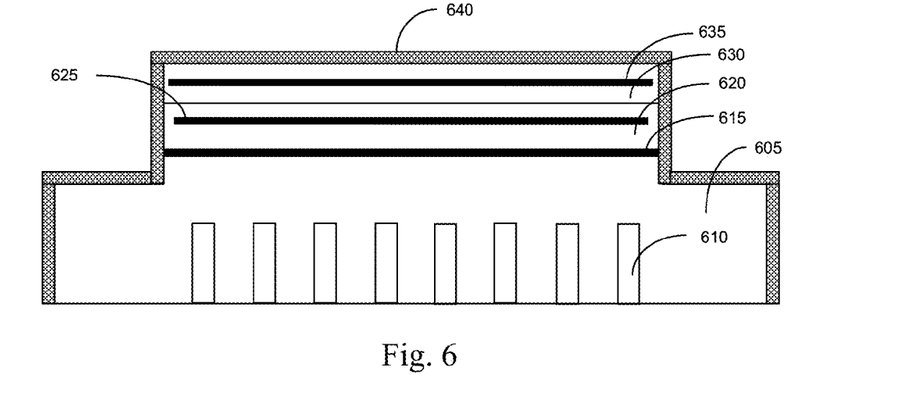
FIG. 6 illustrates another embodiment, wherein the ESC assembly is "packaged" in the coating.

FIG. 6 illustrates another embodiment, wherein the ESC assembly is "packaged" in the coating. That is, in the embodiment of FIG. 6, the various elements making up the ESC, i.e., base 605, thermal barrier 615, dielectric layer 620, thermal conductance layer 630, and electrode 635, are first assembled, and then the entire assembly is coated with A-coatings, such as A-$Y_2O_3$/$Al_2O_3$ coating 640. Therefore, this coating is referred to herein as "packaging," since the entire assembly is coated after assembly. Only the back surface of the base 605 is not coated. For example, if the A-$Y_2O_3$/$Al_2O_3$ coating 640 is fabricated using the PEPVD chamber of FIG. 4, the bottom surface of the base 605 is attached to the holder 405 and is, therefore, not coated. However, this is of no consequence, since as shown in FIG. 3, when in use, the bottom surface of the base 605 is attached to the pedestal 360 or the bottom of the chamber 350, such that it is not exposed to plasma. In addition, the thickness and structure of all thermal barrier layer 615, dielectric layer 620 and thermal conductive layer 630 can be adjusted to reach the improved performance of the A-coating coated ESC.

Figure 7:
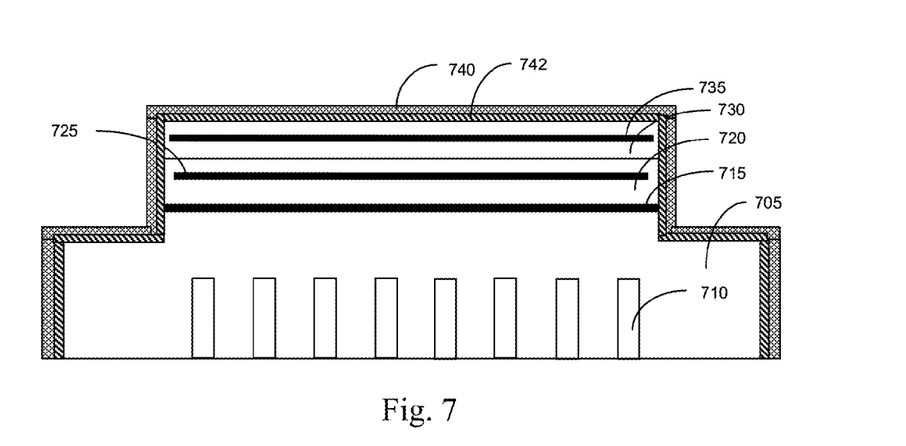
FIG. 7 illustrates another embodiment, wherein the ESC assembly is "packaged" in a double layer coating.

FIG. 7 illustrates another embodiment wherein the ESC assembly is "packaged" in the coating. The embodiment illustrated in FIG. 7 is similar to that of FIG. 6, except that the coating is formed of multiple layers, here two layers 740 and 742, are illustrated. For example, a first coating, 742, can be formed using standard plasma spray of, e.g., $Y_2O_3$, $Al_2O_3$, $ZrO_2$, YAG, $Y_2O_3$/$Al_2O_3$, etc., to a thickness calculated to provide the chuck with desired electrical properties. For example, the first layer 742 can be made thick enough to provide good dielectric properties. Then, a second layer 740 of, e.g., PEPVD A-$Y_2O_3$/$Al_2O_3$ coating, if formed over the first layer, so as to provide the required smooth surface, low to no porosity, and high resistance to abrasion and plasma attack. An example of a PEPVD top coat formed over a PEPVD undercoat is shown in FIG. 5(*d*), wherein the top coat has a thickness of 5.5 um and the undercoat has a thickness of 20 um.

According to various embodiments, the intermediate coating 742 could be of metals, alloys, or ceramics (such as $Y_2O_3$, $YF_3$, YAG, $ErO_2$, SiC, $Si_3N_4$, $SiO_2$, $ZrO_2$, $Al_2O_3$, AlN and their combinations or combination of them with other elements). The second or the top coating 740, with the surface facing to plasma, can be made of hybrid coating using optimal combination of $Y_2O_3$ and $Al_2O_3$, $Y_2O_3$ and AlN, $YF_3$ and $Al_2O_3$, $ErO_2$ and $Al_2O_3$, and so on. The coating packaged ESCs with A-coating thus have the features of increased hardness, stable structure surface, and good thermal and electrical characteristics.

According to other embodiments, the ESC is assembled only by the stacking of the coating layers. In this embodiment, the thermal barrier layer 715 can be the plasma sprayed coating or the polymerization coating over the ESC base 705. The dielectric layer 720 is plasma sprayed over the thermal barrier and the heater 725 is embedded inside the dielectric layer by either plasma spray or metallization. Then the thermal conductive and dielectric insulating layer 730 is stocked over the dielectric layer 720 by plasma spray or other processes and the conductive electrode 735 is embedded inside the thermal conductive and dielectric insulating layer 730. Finally, the A-coating 740 or plus the undercoated layer 742 is (are) used to form the "packaged" ESC.

According to disclosed embodiment, refurbishment of the coating-packaged ESC is made simple so as to reduce the production cost. Namely, the ESC surface coating can be removed by means such as sand blasting, grinding, polishing, etc., without having to disassemble the various elements forming the ESC. Then reworked ESC surface is easily re-coated with the advanced plasma resistant coating using any of the method described herein, such that the ESC is re-functioned for service.

To reduce the particle and contamination, to increase the work life time, and to improve the performance, the above methods and the advanced plasma resistant coatings can be applied to other plasma chambers or to other components, such as showerhead, process kits, etc., used in the plasma and etch chamber/systems.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

What is claimed is:

1. An electrostatic chuck (ESC) assembly for a plasma processing chamber, comprising:
    a base plate;
    a dielectric layer over the base plate;
    an electrode over the dielectric layer; and,
    an advanced coating consisting of a mixture of $Y_2O_3$/$Al_2O_3$ or $YF_3$/$Al_2O_3$ and covering the ESC assembly except for rear surface of the base plate.

2. The ESC assembly of claim 1, further comprising an undercoat layer provided under the advanced coating.

3. The ESC assembly of claim 2, wherein the undercoat layer comprises at least one of $Y_2O_3$ and $Al_2O_3$.

4. The ESC assembly of claim 2, wherein the undercoat layer comprises at least one of $Y_2O_3$, $YF_3$, YAG, $ErO_2$, SiC, $Si_3N_4$, $SiO_2$, $ZrO_2$, $Al_2O_3$, AlN, and their combinations.

5. The ESC assembly of claim 1, wherein the advanced coating comprises plasma enhanced physical vapor deposited $Y_2O_3$/$Al_2O_3$ or $YF_3$/$Al_2O_3$.

6. A method for fabricating an electrostatic chuck (ESC) assembly, comprising:
   forming a dielectric layer over a base plate and an electrode over the dielectric layer to thereby form the ESC assembly;
   inserting the ESC assembly into a vacuum chamber in an orientation such that it faces a source material positioned within the vacuum chamber;
   evaporating or sputtering the source material inside the vacuum chamber;
   injecting gas containing reactive species and non-reactive species into the vacuum chamber; and
   forming plasma in front of the ESC assembly, such that ions of the reactive species and non-reactive species impinge upon the ESC assembly, to thereby form a coating over the ESC assembly, wherein the coating comprises atoms from the source materials and atoms from the reactive species to thereby form a mixture of $Y_2O_3/Al_2O_3$ or $YF_3/Al_2O_3$.

7. The method of claim 6, wherein the source material comprises yttrium and aluminum.

8. The method of claim 7, wherein the non-reactive species comprises argon and the reactive species comprises one of oxygen or fluorine.

9. A method of claim 6, further comprising applying negative bias to the ESC assembly while maintaining the plasma inside the vacuum chamber.

10. The method of claim 9, further comprising applying an intermediate coating to the ESC assembly prior to inserting the ESC assembly into the vacuum chamber.

11. The method of claim 10, wherein the intermediate coating is formed by plasma spray.

12. The method of claim 11, wherein applying the intermediate coating comprises applying plasma spray coatings of $Y_2O_3$, $YF_3$, YAG, $ErO_2$, SiC, $Si_3N_4$, $SiO_2$, $ZrO_2$, $Al_2O_3$, AlN, and their combinations.

13. The ESC assembly of claim 1, wherein the advanced coating comprises a mixture of 40% Al2O3 and 60% Y2O3.

14. The method of claim 6, wherein the coating comprises a mixture of 40% Al2O3 and 60% Y2O3.

15. The method of claim 6, comprising utilizing two evaporation sources, one is for yttrium and another for aluminum to thereby evaporated the yttrium and aluminum separately.

16. The method of claim 15, further comprising applying different power levels to the two evaporation sources.

17. The method of claim 6, wherein evaporating the source material comprises directing electron beam onto the source material.

* * * * *